US012617989B2

(12) United States Patent
Park et al.

(10) Patent No.: US 12,617,989 B2
(45) Date of Patent: May 5, 2026

(54) ABRASIVE AND METHOD FOR PLANARIZATION USING THE SAME

(71) Applicants:OCI Company Ltd., Seoul (KR);
Research & Business Foundation SUNGKYUNKWAN UNIVER,
Gyeonggi-do (KR)

(72) Inventors: Younghun Park, Seongnam-si (KR);
Eungchul Kim, Suwon-si (KR);
Taesung Kim, Suwon-si (KR);
Sangyup Lee, Seongnam-si (KR);
Kyungyeol Kim, Seongnam-si (KR);
Hwisu Oh, Seongnam-si (KR)

(73) Assignees: OCI Company Ltd., Seoul (KR);
Research & Business Foundation SUNGKYUNKWAN UNIVERSITY,
Gyeonggi-do (KR)

( * ) Notice: Subject to any disclaimer, the term of this patent is extended or adjusted under 35 U.S.C. 154(b) by 843 days.

(21) Appl. No.: 17/792,893

(22) PCT Filed: Jan. 15, 2021

(86) PCT No.: PCT/KR2021/000633
§ 371 (c)(1),
(2) Date: Jul. 14, 2022

(87) PCT Pub. No.: WO2021/145739
PCT Pub. Date: Jul. 22, 2021

(65) Prior Publication Data
US 2023/0054423 A1 Feb. 23, 2023

(30) Foreign Application Priority Data
Jan. 15, 2020 (KR) ........................ 10-2020-0005624

(51) Int. Cl.
| | |
|---|---|
| *C09K 3/14* | (2006.01) |
| *C01B 33/18* | (2006.01) |
| *C09G 1/02* | (2006.01) |
| *H10P 95/00* | (2026.01) |
| *H10W 10/00* | (2026.01) |
| *H10W 10/17* | (2026.01) |

(52) U.S. Cl.
CPC ............ *C09K 3/1409* (2013.01); *C01B 33/18* (2013.01); *C09G 1/02* (2013.01); *H10P 95/062* (2026.01);
(Continued)

(58) Field of Classification Search
CPC ........ C09K 3/1409; C09K 3/14; C01B 33/18; C09G 1/02; H01L 21/31053;
(Continued)

(56) References Cited

U.S. PATENT DOCUMENTS

| | | | |
|---|---|---|---|
| 6,063,306 A | 5/2000 | Kaufman et al. | |
| 7,799,687 B2 | 9/2010 | Seong et al. | |

(Continued)

FOREIGN PATENT DOCUMENTS

| | | |
|---|---|---|
| JP | 2017-197693 A | 11/2017 |
| KR | 10-2001-0053166 A | 6/2001 |

(Continued)

OTHER PUBLICATIONS

Machine Translation of JP-2017197693-A (Year: 2017).*
(Continued)

*Primary Examiner* — Jennifer A Smith
*Assistant Examiner* — Sarah Catherine Case
(74) *Attorney, Agent, or Firm* — HoustonHogle LLP

(57) ABSTRACT
The present invention relates to an abrasive and a planarization method using the same, and more particularly, includes fumed silica. A BET specific surface area of the fumed silica is 200 m²/g to 450 m²/g, a shape of aggregates dispersed in the abrasive has an elongated shape or a round
(Continued)

shape, and a ratio of the round shape of the aggregates is 50% to 90%.

8 Claims, 17 Drawing Sheets

(52) U.S. Cl.
CPC ......... *H10W 10/014* (2026.01); *H10W 10/17* (2026.01); *C01P 2004/50* (2013.01); *C01P 2004/54* (2013.01); *C01P 2006/12* (2013.01)

(58) Field of Classification Search
CPC ............. H01L 21/76224; H01L 21/762; C01P 2004/50; C01P 2004/54; C01P 2006/12
See application file for complete search history.

(56) References Cited

U.S. PATENT DOCUMENTS

| | | | |
|---|---|---|---|
| 9,593,272 | B2 | 3/2017 | Nakamura et al. |
| 10,607,853 | B2 | 3/2020 | Noh et al. |
| 2019/0270914 | A1 | 9/2019 | Ueda et al. |

FOREIGN PATENT DOCUMENTS

| | | | |
|---|---|---|---|
| KR | 10-0829594 | B1 | 5/2008 |
| KR | 10-2016-0011453 | A | 2/2016 |
| KR | 10-1750741 | B1 | 6/2017 |
| KR | 10-1854499 | B1 | 5/2018 |
| KR | 10-2018-0085901 | A | 7/2018 |
| KR | 10-2019-0077397 | A | 7/2019 |
| KR | 10-2019-0080616 | A | 7/2019 |

OTHER PUBLICATIONS

International Search Report of the International Searching Authority, mailed on Apr. 21, 2021, from International Application No. PCT/KR2021/000633, filed on Jan. 15, 2021. 7 pages.

Written Opinion mailed on Apr. 21, 2021, from International Application No. PCT/KR2021/000633, filed on Jan. 15, 2021. 8 pages.

International Preliminary Report on Patentability Received for International Application No. PCT/KR2021/000633 mailed on Jul. 28, 2022, 11 Pages.

* cited by examiner

FIG. 15

ABRASIVE AND METHOD FOR PLANARIZATION USING THE SAME

RELATED APPLICATIONS

This application is a § 371 National Phase Application of International Application No. PCT/KR2021/000633, filed on Jan. 15, 2021, now International Publication No. WO 2021/145739 A1, published on Jul. 22, 2021, which International Application claims priority to Korean Application 10-2020-0005624, filed on Jan. 15, 2020, both of which are incorporated herein by reference in their entirety.

TECHNICAL FIELD

The present invention relates to an abrasive and a planarization method using the same, and more particularly, relates to an abrasive for a CMP and a planarization method using the same.

BACKGROUND ART

High integration of a semiconductor device progresses yearly. Accordingly, in a manufacturing process of the semiconductor device, quality required for a surface of each layer becomes stricter year by year. In accordance with this requirement, in a chemical mechanical polishing method (hereinafter, CMP), which is a semiconductor surface processing technology, for a polishing object, it is required that the CMP has less contamination, less scratches, high material removal rate, and high selectivity for a target object to be polished. In general, silica, cerium oxide, or the like is used as abrasive particles for the CMP.

Fumed silica may form secondary particles by strongly aggregating primary particles with one another by fusion. The secondary particles may slightly aggregate with one another to form tertiary particles. In general, fumed silica in a powder state may exist as the tertiary particles.

DISCLOSURE OF THE INVENTION

Technical Problem

The present invention provides an abrasive including fumed silica for a CMP.

The present invention provides a planarization method using the abrasive.

Technical Solution

An abrasive for a CMP according to the inventive concept of the present invention may include fumed silica. A BET specific surface area of the fumed silica may be 200 m²/g to 450 m²/g, a shape of aggregates dispersed in the abrasive may have an elongated shape or a round shape, and a ratio of the round shape of the aggregates may be 50% to 90%.

A planarization method according to the inventive concept of the present invention may include forming a polishing object layer on a wafer and planarizing a polishing target layer using the abrasive until a surface of the wafer is exposed.

Advantageous Effects

The abrasive according to the present invention may include the fumed silica having a relatively large specific surface area and consisting of round-shaped aggregates.

Accordingly, while maintaining an excellent material removal rate, a surface roughness of a polishing target may be lowered. The abrasive according to the present invention may prevent damage to a wafer surface, and thus may be effectively applied to a front end of line (FEOL) process during a manufacturing process of a semiconductor device.

BRIEF DESCRIPTION OF IDE DRAWINGS

FIGS. 13 to 16 are cross-sectional views for illustrating a CMP process on a wafer according to embodiments of the present invention.

MODE FOR CARRYING OUT THE INVENTION

In order to facilitate sufficient understanding of the configuration and effects of the present invention, preferred embodiments of the present invention will be described with reference to the accompanying drawings. However, the present invention is not limited to the embodiments set forth below, and may be embodied in various forms and modified in many alternate forms. Rather, these embodiments are provided so that this disclosure will be thorough and complete, and will fully convey the scope of the present invention to those skilled in the art to which the present invention pertains.

The terms used herein are for the purpose of describing embodiments and are not intended to be limiting of the present invention. In the present description, singular forms include plural forms unless the context clearly indicates otherwise. As used herein, the terms 'comprises' and/or 'comprising' are intended to be inclusive of the stated elements, and do not exclude the possibility of the presence or the addition of one or more other elements.

Figure 1:
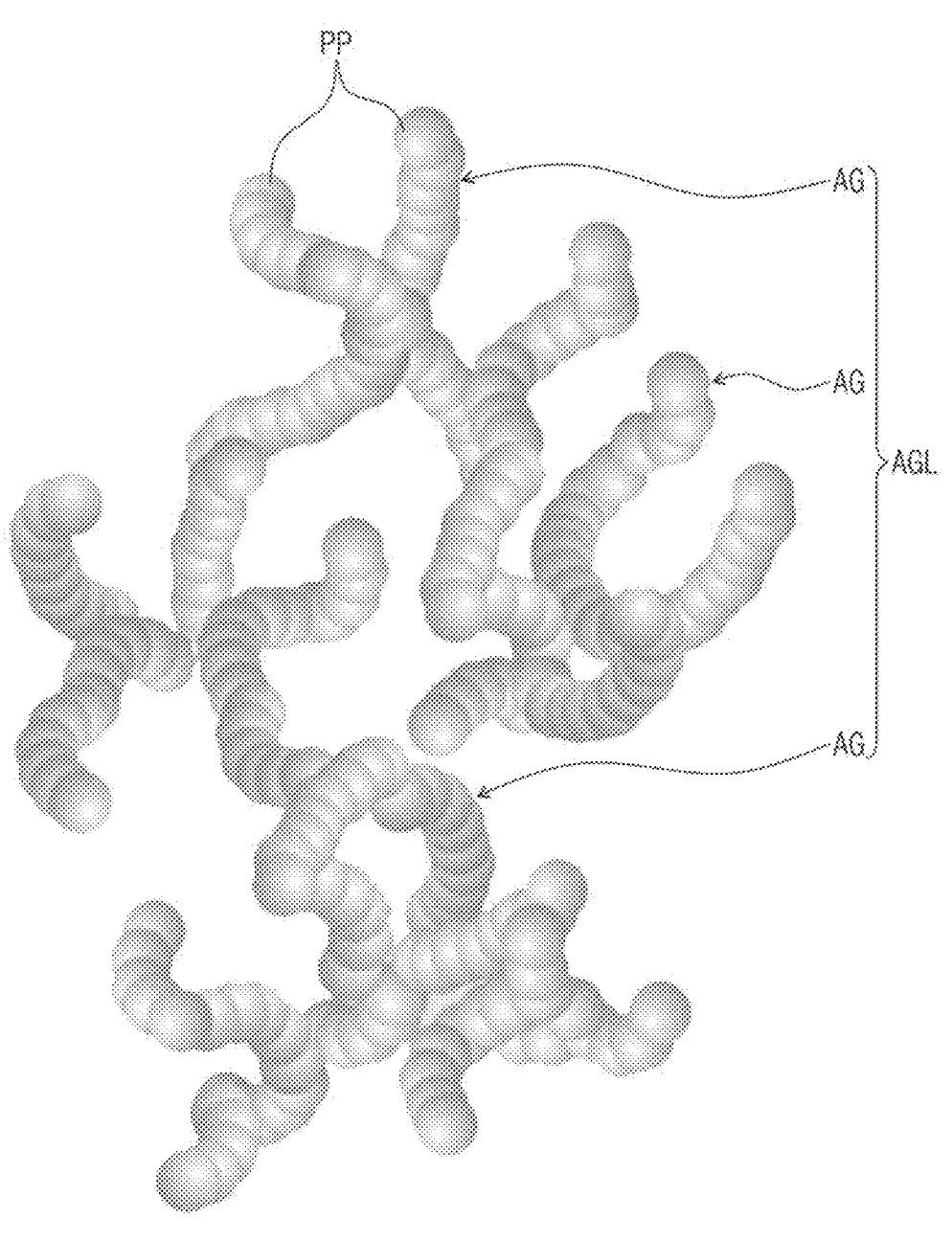
FIG. 1 is a schematic diagram for illustrating particles of fumed silica.

FIG. 1 is a schematic diagram for illustrating particles of fumed silica.

Referring to FIG. 1, fumed silica in a powder state may include particles in a form of an agglomerate AGL, as shown in FIG. 1. When the particles of the fumed silica powder are enlarged, the agglomerate AGL shown in FIG. 1 may be confirmed. The agglomerate AGL may be a tertiary particle of fumed silica.

The agglomerate AGL of the fumed silica may be formed by gathering a plurality of aggregates AG. The aggregates AG may be secondary particles of the finned silica. The aggregates AG may be formed of a plurality of primary particles PP (element particles). For example, an average diameter of the primary particles PP may be 5 nm to 50 nm.

The fumed silica may be formed by hydrolysis of silicon chloride in a flame over 1000° C. formed of oxygen and hydrogen. The aggregates AG, which are the secondary particles, may be formed as the primary particles PP are connected to one another due to collision therebetween formed in the flame. That is, the aggregates AG may include a plurality of the primary particles PP. The aggregates AG may have a three-dimensional structure. Thereafter, as the aggregates AG are agglomerated with one another, the agglomerate AGL, which is a tertiary particle, may be formed.

Silica may be used in an abrasive used in a semiconductor process (e.g., a CMP process). The silica may include fumed silica or colloidal silica. For example, although the fumed silica has good purity and a high material removal rate (MRR), many scratches may be generated on a polished surface, thereby increasing a surface roughness. The colloidal silica may have a relatively small surface roughness due to reduced scratches on the polishing surface, but may have a lower material removal rate and lower purity than those of the fumed silica.

In the abrasive using the fumed silica, the agglomerate AGL of the fumed silica may be dispersed as the aggregates AG, which are the secondary particles. That is, the aggregates AG of the finned silica are particles used for polishing in the CMP process. Accordingly, performance of the abrasive may be determined depending on a shape and size of each of the aggregates AG.

The finned silica may form the secondary particles (the aggregates, AG) by strongly aggregating the primary particles with one another by fusion. The secondary particles may agglomerate weakly with one another to form the tertiary particle (the agglomerate, AGL). In general, the finned silica powder may exist as the tertiary particle. When being strongly dispersed in water, the fumed silica is dispersed to a size of the secondary particles, but not to a size of the primary particles. Therefore, it is known that the CMP is performed in a state of secondary particles. When an enlargement of the secondary particles in the abrasive is suppressed, occurrence of scratches on a surface to be polished may be reduced, and therefore roughness of the surface may be reduced.

For Analyzing the performance of the abrasive, it may be necessary to separately collect and analyze the single aggregates AG from the filmed silica used in the abrasive, or from the abrasive. However, it is technically difficult to separate and collect the single aggregates (i.e., single secondary particles) from the finned silica due to effects of surface hydrogen bonding of the fumed silica, thickening effect, and pH. The term "single aggregate" used in the present invention may mean that the aggregate AG, which is the secondary particle of the fumed silica, does not aggregate with other aggregates AG, and exists as one secondary particle alone.

When the single aggregates are analyzed to systematically classify their shape, it may help in the abrasive performance analysis. However, a systematic algorithm for classifying the shape of the single aggregates of the fumed silica has not been established.

According to embodiments of the present invention, a method for separating and collecting single aggregates from an abrasive or fumed silica may be provided. The collected single aggregates are analyzed by an image analysis, and a shape of the single aggregate may be classified into one of a linear shape, a branched shape, an elliptical shape, and a circular shape according to the algorithm presented in the present invention. By analyzing the shape of single aggregates, a grade of the fumed silica may be analyzed, and further, it may be used as an index for analyzing performance of the abrasive.

Figure 2:
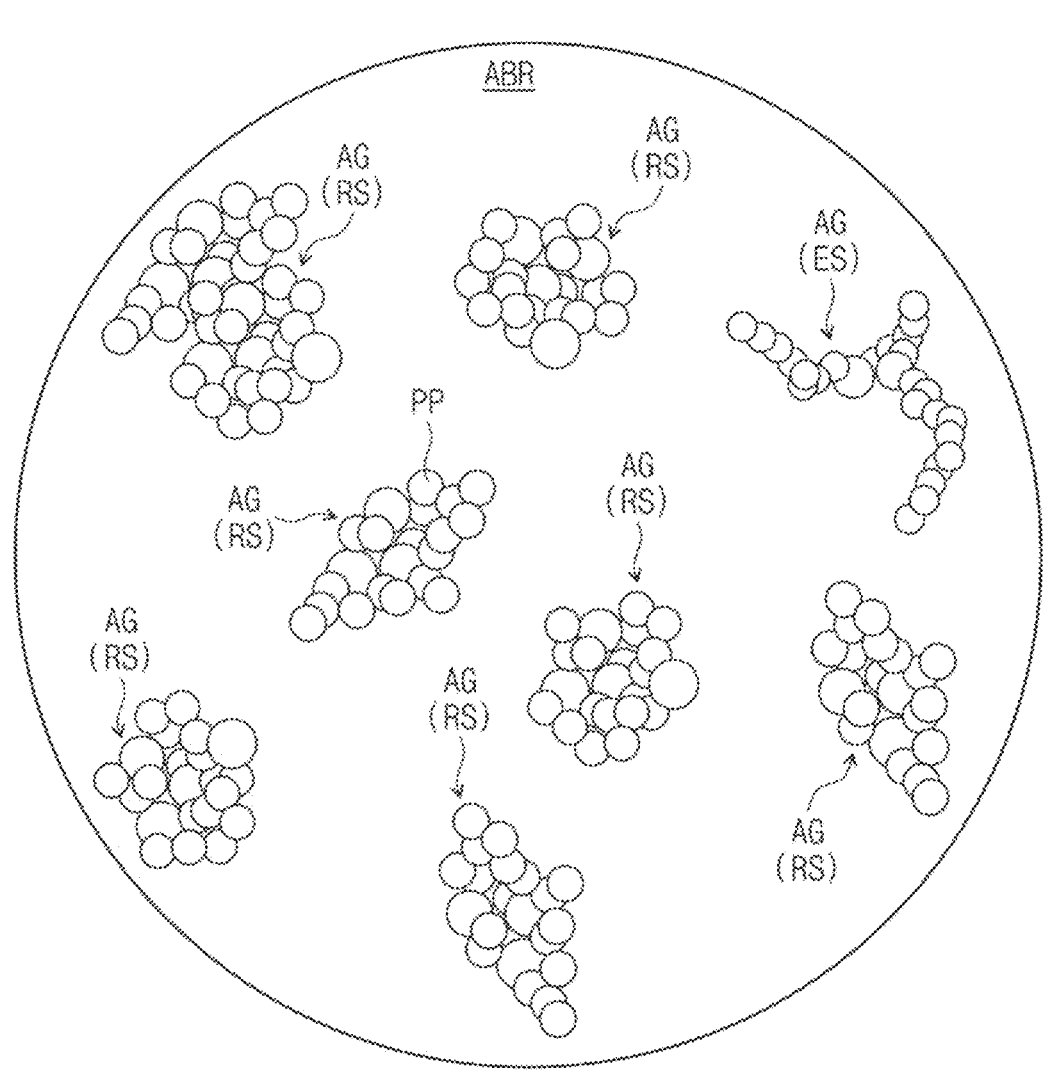
FIG. 2 is a conceptual diagram for illustrating an abrasive according to embodiments of the present invention.

FIG. 2 is a conceptual diagram for illustrating an abrasive according to embodiments of the present invention.

An abrasive ABR according to embodiments of the present invention may include fumed silica. Specifically, the abrasive ABR may be a slurry in which the finned silica is dispersed in water. In the abrasive ABR, the finned silica may be dispersed as aggregates AG, which are secondary particles. Ideally, the aggregates AG in the abrasive ABR may be spaced apart from one another without being aggregated. As described above, each of the aggregates AG may be formed of primary particles PP.

The finned silica used in the abrasive ABR of the present invention may have a specific surface area of 170 m²/g to 500 m²/g according to a Brunauer Emmett Telle (BET) method. Preferably, the specific surface area of the fumed silica may be 200 m²/g to 450 m²/g. More preferably, the specific surface area of the finned silica may be 200 m²/g to 400 m²/g.

In general, finned silica having a specific surface area of less than 150 m²/g is used for the abrasive ABR. As the abrasive ABR according to embodiments of the present invention, fumed silica having a relatively large specific surface area may be used. When fumed silica having a specific surface area greater than 150 m²/g is used in the abrasive ABR of the present invention, a surface roughness of a polishing surface may be greatly reduced.

A shape of the aggregates AG dispersed in the abrasive ABR of the present invention may be largely classified into an elongated shape ES or a round shape RS. In detail, the shape of the aggregates AG has a linear shape or a branched shape as the elongated shape, and an elliptic or circular shape as the round shape.

As shown in FIG. 2, most of the shapes of the aggregates AG in the abrasive ABR may be the round shape RS (i.e., elliptic shape or circular shape). A ratio of aggregates having the round shape RS to the total number of aggregates AG, in the abrasive ABR, may be 50% to 90%. The rest may be in the elongated shape ES.

For example, as illustrated in FIG. 2, the number of aggregates AG of the round shape RS is 7, whereas the number of aggregates AG of the elongated shape ES is one, and thus it may be seen that a ratio of the round shape RS is larger than a ratio of the elongated shape ES.

When the ratio of the round shape RS of the aggregates AG is less than 50%, the roughness of the polishing surface is greatly increased, and thus it is difficult to use for polishing a surface of a wafer to which a fine process is applied.

A detailed method of measuring a shape distribution ratio of the aggregates AG in the abrasive ABR will be described later.

The abrasive ABR may further include at least one of a dispersant, a pH adjusting agent, a surfactant, a viscosity adjusting agent, and other additives.

The pH adjusting agent may be selected from the group consisting of potassium hydroxide, sodium hydroxide, magnesium hydroxide, rubidium hydroxide, cesium hydroxide, sodium hydrogen carbonate, sodium carbonate, ammonia, ammonium methyl propanol (AMP), and tetra methyl ammonium hydroxide (TMAH).

The surfactant may be selected from the group consisting of glycine, alanine, serine, phenylalanine, threonine, valine, leucine, isoleucine, proline, histidine, lysine, arginine, aspartic acid, tryptophan, glutamine, betaine, cocomidopropyl-betaine. and lauryl propylbetaine.

The viscosity adjusting agent may be selected from the group consisting of polyethylene glycol, polypropylene glycol, polyvinyl pyrrolidone, polyoxyalkylene alkyl ether, polyoxyalkylene alkyl ester, polyoxyethylene methyl ether, polyethylene glycol sulfonic acid, polyvinyl alcohol, polyethylene oxide, polypropylene oxide, polyalkyl oxide, polyoxyethylene oxide, polyethylene oxide-propylene oxide copolymer, cellulose, methyl cellulose, methyl hydroxyethyl cellulose, methyl hydroxypropyl cellulose, hydroxyethyl cellulose, carboxymethyl cellulose, carboxymethylhydroxy-ethylcellulose, sulfoethylcellulose, and carboxymethylsulfo-ethylcellulose.

A content of the viscosity adjusting agent may be 0.1 wt % to 1.0 wt % based on the total weight of the abrasive ABR. When the viscosity adjusting agent is more than 1.0 wt %, dispersion stability of the fumed silica may be lowered, and thus a size of the particles may increase and there may be a problem in that the polishing surface is scratched.

For example, the other additives may include an etchant capable of increasing an etch selectivity of the abrasive ABR.

Hereinafter, a method for measuring a shape distribution ratio of aggregates AG in an abrasive ABR described above will be described.

Figure 3:
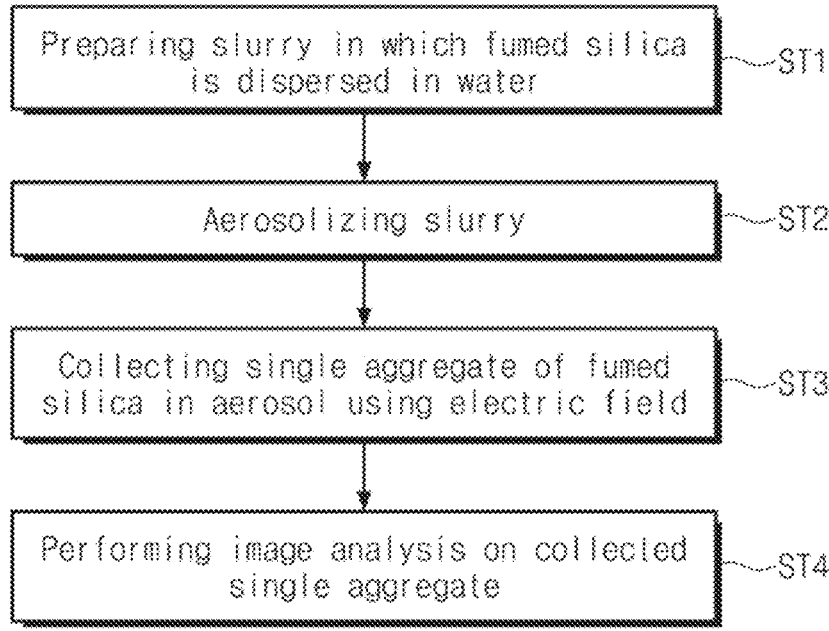
FIG. 3 is a flowchart for illustrating a method for separating and collecting single aggregates from fumed silica according to embodiments of the present invention.
Figure 4:
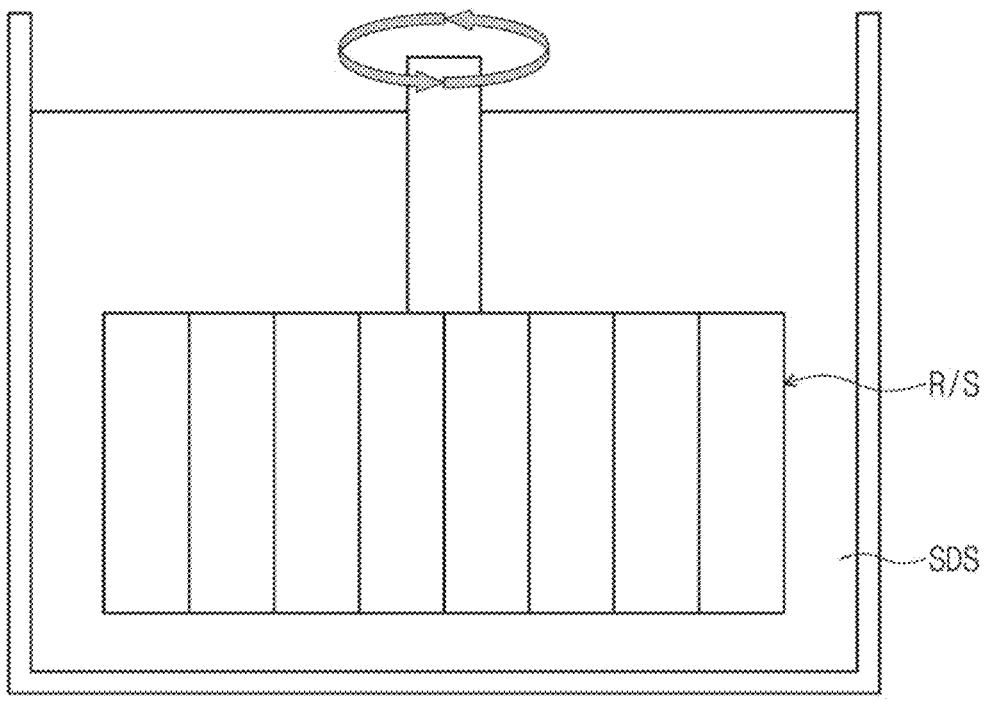
FIG. 4 is a conceptual diagram for illustrating forming a slurry from fumed silica.
Figure 5:
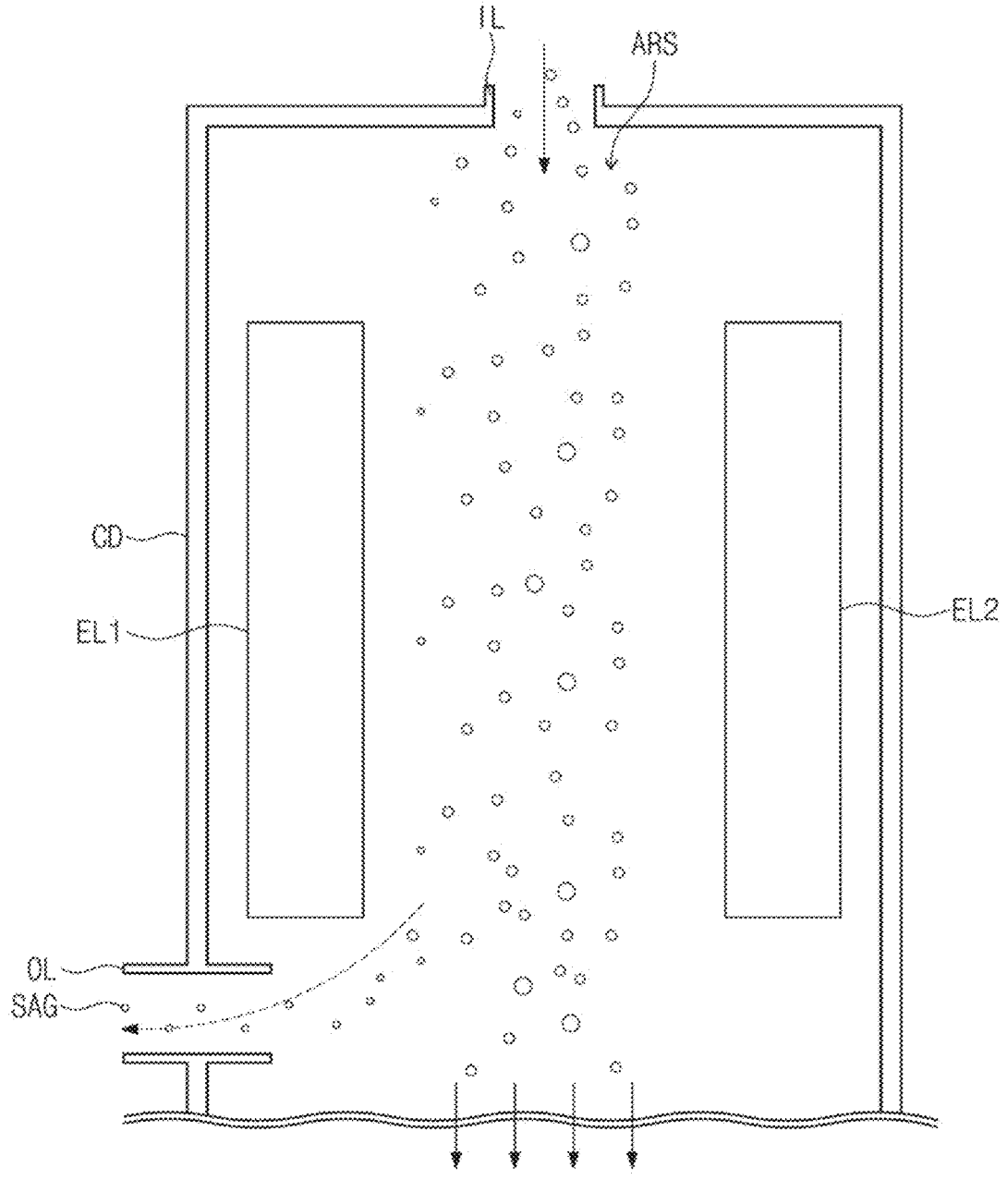
FIG. 5 is a conceptual diagram for illustrating collecting single aggregates of fumed silica in an aerosol.

First, a method for separating and collecting single aggregates from an abrasive or fumed silica powder will be described. FIG. 3 is a flowchart illustrating a method for separating and collecting single aggregates from fumed silica according to embodiments of the present invention. FIG. 4 is a conceptual diagram for illustrating forming a slurry from fumed silica. FIG. 5 is a conceptual diagram for illustrating collecting single aggregates of fumed silica in an aerosol.

Referring to FIGS. 3 and 4, a slurry in which fumed silica is dispersed in water may be prepared in ST1.

An example of preparing the slurry using fumed silica in powder form will be described first. A slurry SDS may be prepared by mixing the fumed silica powder with water (e.g., DI WATER). The fumed silica powder may be evenly dispersed in the slurry SDS through a rotor/stator R/S, which is a high-speed homogenizer. For example, the rotor may rotate at 3,000 RPM to 4,000 RPM, and may be operated for 10 to 30 minutes.

Because the rotor/stator R/S physically collides with the particles and pulverizes the particles into small pieces, the agglomerate AGL, which is a tertiary particle, may be pulverized and dispersed in the slurry SDS in a form of the aggregates AG, which are secondary particles.

Thereafter, a basic pH adjusting agent such as potassium hydroxide (KOH) and/or sodium hydroxide (NaOH) may be added to the slurry SDS to adjust a pH of the slurry SDS to 10 to 12. When the pH of the slurry SDS is adjusted to 10 to 12, the fumed silica (e.g., the aggregates AG) dispersed in the shiny SDS may be stabilized.

While forming the shiny SDS, a temperature of the slurry SDS may be increased by the rotor/stator R/S. Here, the temperature of the slurry SDS may be maintained at 10° C. to 25° C. using a cooling device.

As another example, the slurry in which the fumed silica is dispersed may be the above-described abrasive ABR. The abrasive ABR may be a slurry in which the fumed silica is already dispersed in the water, strongly dispersing the fumed silica powder in the water previously described with reference to FIG. 4 may be omitted. Preferably, the pH to 10 to 12 may be adjusted by adding a pH adjusting agent to the abrasive ABR. If necessary, more water may be added to the abrasive ABR to lower a viscosity.

Referring to FIG. 3, the slurry SDS may be aerosolized in ST2. Forming the aerosol from the slurry SDS may use a method of atomization of a solution. For example, the slurry SDS may be sprayed in a form of a mist using a nozzle, thereby forming an aerosol.

Referring to FIGS. 3 and 5, the aerosol ARS may be injected into the collection device CD, and single aggregates SAG may be collected from the aerosol ARS in ST3. Specifically, the aerosol ARS may be injected into an inlet IL of the collection device CD. The injected aerosol ARS may flow between a first electrode EL1 and a second electrode EL2 of the collection device CD. An electric field may be formed between the first electrode EL1 and the second electrode EL2. For example, a positive voltage may be applied to the first electrode EL1 and a ground voltage may be applied to the second electrode EL2. The electric field may be formed by a potential difference between the first electrode EL1 and the second electrode EL2.

Because a size of the single aggregates SAG in the aerosol ARS is very fine (300 nm or less), the single aggregates SAG may move closer to the first electrode EL1 by the electric field. For example, because the single aggregates SAG have a negative charge, the single aggregates SAG may move toward the first electrode EL1 to which a positive voltage is applied, through electrical attraction. Accordingly, the single aggregates SAG may be collected and pass through a collecting port OL located under the first electrode ELL Particles other than the single aggregates SAG may relatively be large in size, and thus the particles may not be collected through the collecting port OL and may fall toward a bottom of the collecting device CD.

Then, a plurality of single aggregates SAG may be collected in a form separated from one another. An image analysis may be performed on each of the separated single aggregates SAG in ST4. For example, microscopy may be performed on each of the single aggregates SAG. A TEM analysis was performed and resulting images are shown in FIGS. 6A to 6D. As illustrated in FIGS. 6A to 6D, the single aggregates SAG may have various shapes.

Figure 7:
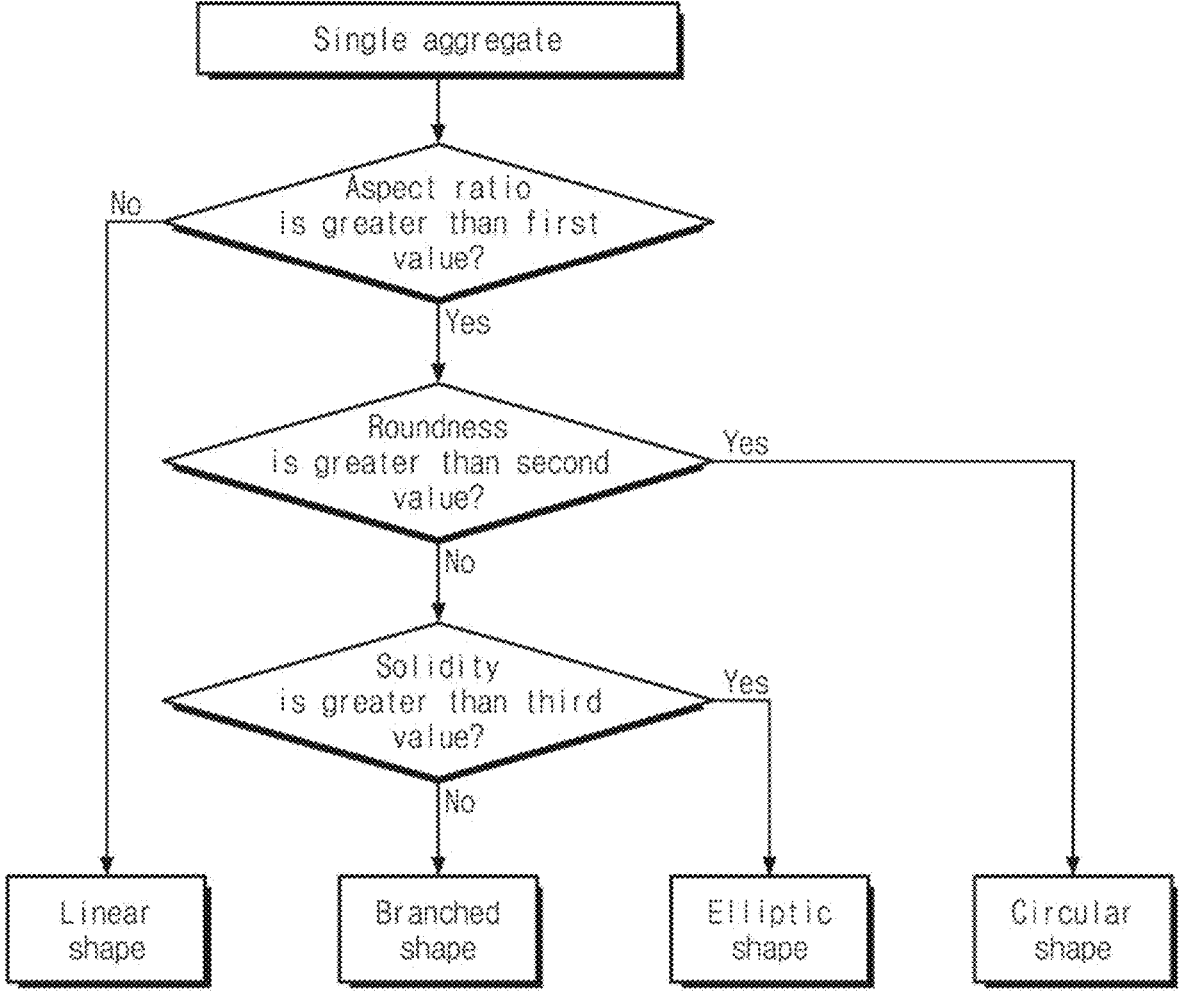
FIG. 7 is an algorithm for classifying a shape of single aggregates according to embodiments of the present invention.

A shape classification method for systematically classifying the shape of the single aggregates SAG will be described. FIG. 7 is an algorithm for classifying a shape of single aggregates according to embodiments of the present invention.

Referring to FIG. 7, various parameters used in a shape classification algorithm of single aggregates SAG may be measured first. The parameters used in the algorithm include an aspect ratio, a roundness, and a solidity.

Figure 8:
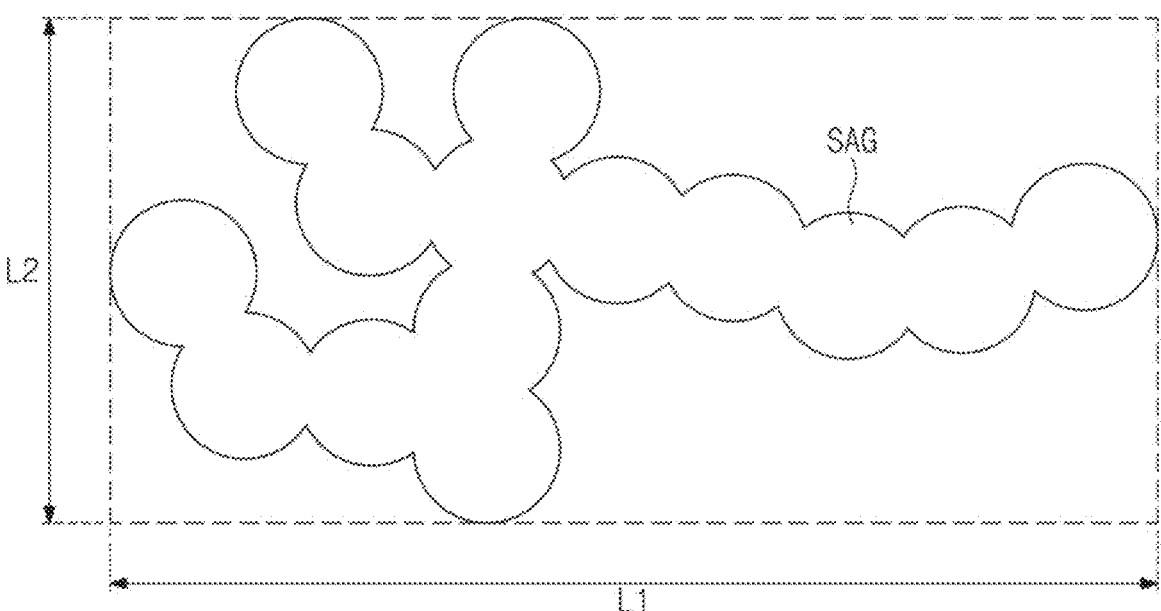
FIG. 8 is a conceptual diagram for illustrating an aspect ratio of single aggregates.

The aspect ratio of the single aggregates SAG will be described with reference to FIG. 8. Referring to a TEM image obtained through image analysis, the single aggregates SAG may have the longest first length L1 in a first direction. The single aggregates SAG may have the shortest second length L2 in a second direction intersecting the first direction. A ratio L2/L1 of the second length L2 to the first length L1 may be defined as the aspect ratio.

Figure 9:
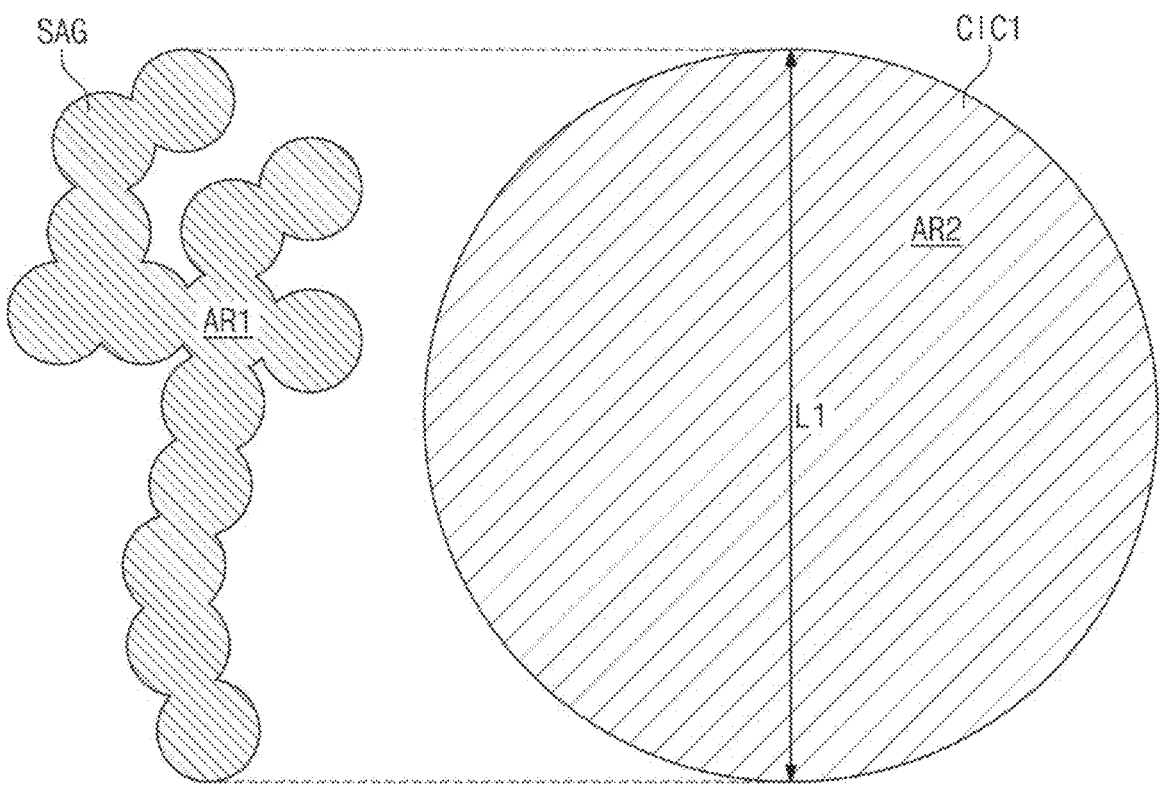
FIG. 9 is a conceptual diagram for illustrating a roundness of single aggregates.

The roundness of the single aggregates SAG will be described with reference to FIG. 9. The single aggregates SAG shown in a TEM image may have a first area AR1, two-dimensionally. Meanwhile, a first circle CIC1 having a diameter of the first length L1 of the single aggregates SAG shown in FIG. 8 may be defined. The first circle CIC1 may have a second area AR2. The roundness may be a ratio AR1/AR2 of the first area AR1 to the second area AR2.

Specifically, the second area AR2 may have the following value.

$$AR2 = \frac{\pi \cdot L1^2}{4}$$

Accordingly, the roundness may be calculated by Equation 1 below.

$$Roundness = \frac{4 \cdot AR1}{\pi \cdot L1^2} \qquad \text{[Equation 1]}$$

Figure 10:
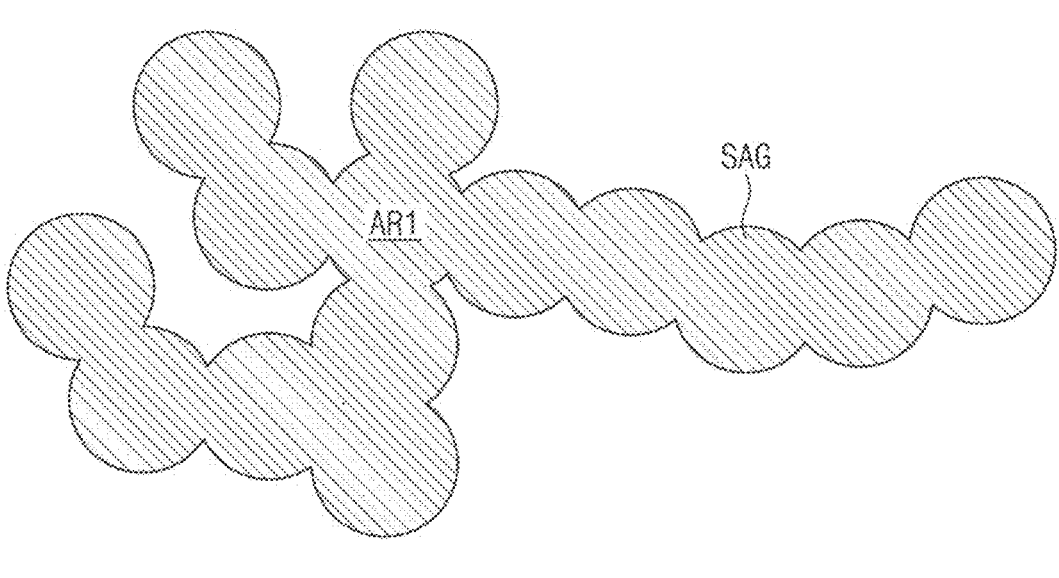
FIG. 10 is a conceptual diagram for illustrating a solidity of single aggregates.
Figure 10:
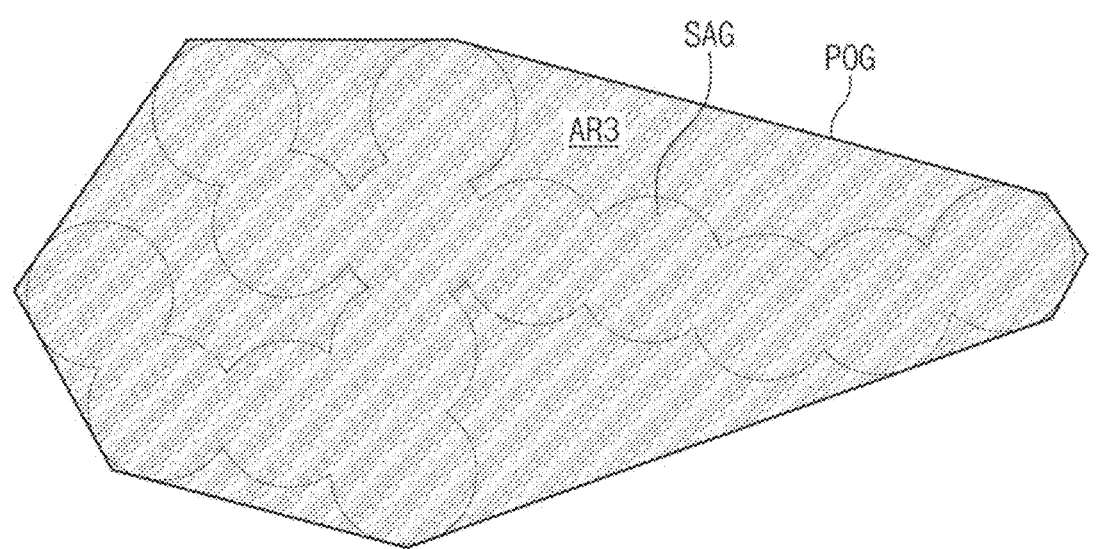

The solidity of the single aggregates SAG will be described with reference to FIG. 10. The single aggregates SAG shown in a TEM image may have the first area AR1, two-dimensionally. The outermost of the single aggregates SAG with a straight line may be connected to define a polygon POG including the single aggregates SAG. The polygon POG may have a third area AR3. The solidity may be a ratio AR1/AR3 of the first area AR1 to the third area AR3.

Figure 6A:
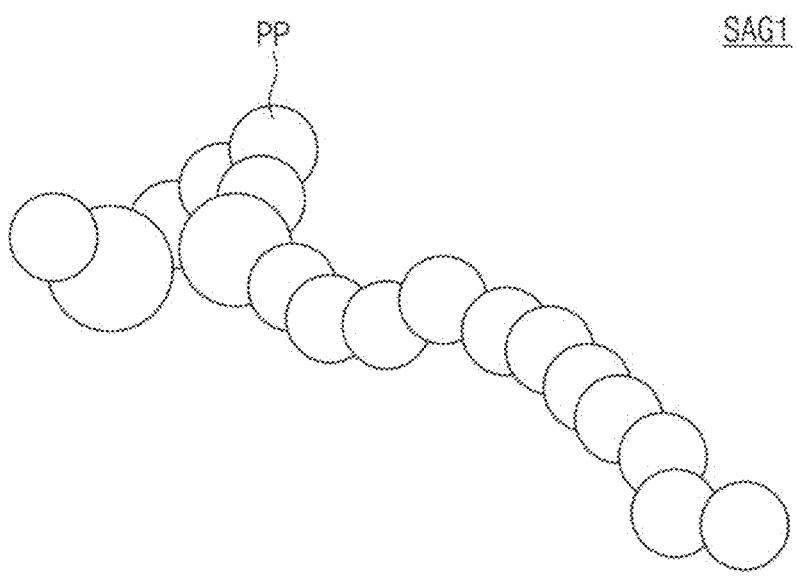
FIGS. 6A to 6D are images each illustrating single aggregates having various shapes.

In one embodiment, an algorithm of FIG. 7 based on a TEM image of a first single aggregates SAG1 shown in FIG. 6A is performed, and it will be described that a shape of the first single aggregates SAG1 is classified. An aspect ratio of the first single aggregates SAG1 is measured to determine whether the aspect ratio is greater than a first value. For example, the first value may be 0.533. The aspect ratio of the first single aggregates SAG1 may be less than the first value (0.533), and thus a shape of the first single aggregates SAG1 may be classified as a linear shape.

Figure 6B:
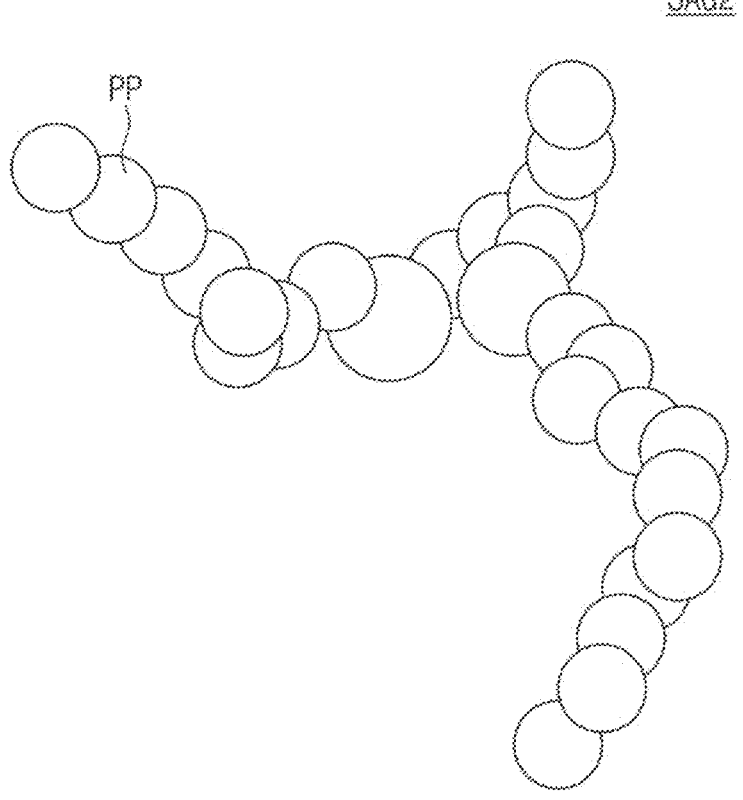
Figure 6C:
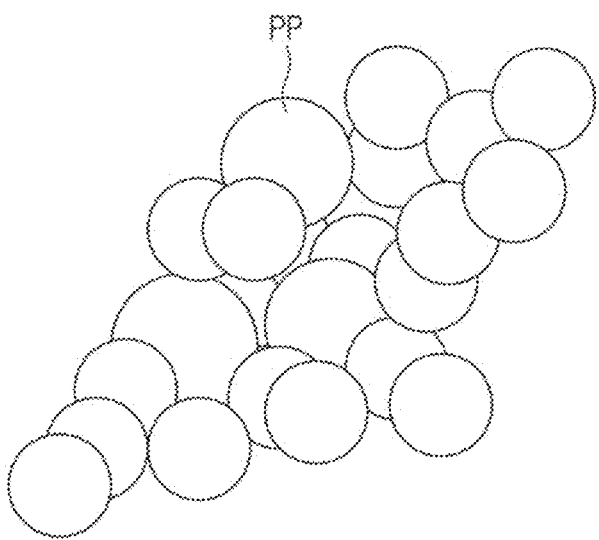
Figure 6D:
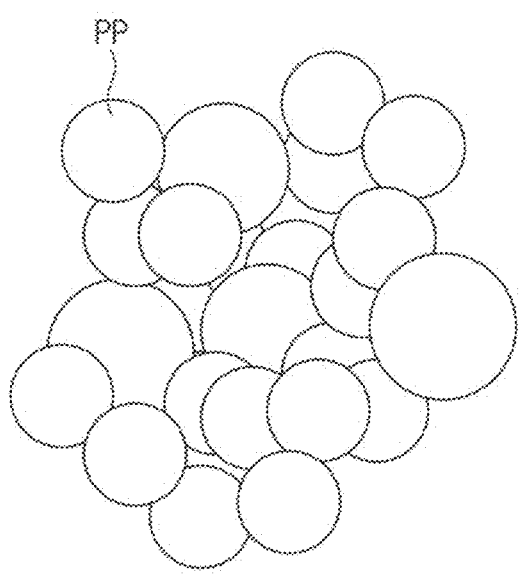

In one embodiment, the algorithm of FIG. 7 is performed based on a TEM image of a fourth single aggregates SAG4 shown in FIG. 6D, and it will be described that a shape of the fourth single aggregates SAG4 is classified. An aspect ratio of the fourth single aggregates SAG4 is measured to determine whether the aspect ratio is greater than the first value. The aspect ratio of the fourth single aggregates SAG4 may be greater than the first value (0.533), and then the roundness, a next step, is measured. It is checked whether the roundness of the fourth single aggregates SAG4 is greater than a second value. For example, the second value may be 0.7. The roundness of the fourth single aggregates SAG4 may be greater than the second value (0.7), and thus a shape of the fourth single aggregates SAG4 may be classified as a circular shape.

In one embodiment, the algorithm of FIG. 7 is performed based on a TEM image of a third single aggregates SAG3 shown in FIG. 6C and it will be described that a shape of the third single aggregates SAG3 is classified. An aspect ratio of the third single aggregates SAG3 is measured to determine whether the aspect ratio is greater than the first value. The aspect ratio of the third single aggregates SAG3 may be greater than the first value (0.533), and then the roundness, the next step, is measured. The roundness of the third single aggregates SAG3 may be less than the second value (0.7), and then the solidity, a next step, is measured. It is checked whether the solidity of the third single aggregates SAG3 is greater than a third value. For example, the third value may be 0.76. The solidity of the third single aggregates SAG3 may be greater than the third value (0.76), and thus the shape of the third single aggregates SAG3 may be classified as an elliptical shape.

In one embodiment, the algorithm of FIG. 7 is performed based on a TEM image of a second single aggregates SAG2 shown in FIG. 6B and it will be described that a shape of the second single aggregates SAG2 is classified. An aspect ratio of the second single aggregates SAG2 is measured to determine whether the aspect ratio is greater than the first value. The aspect ratio of the second single aggregates SAG2 may be greater than the first value (0.533), and then the roundness, the next step, is measured. The roundness of the second single aggregates SAG2 may be less than the second value (0.7), the solidity, the next step, is measured. The solidity of the second single aggregates SAG2 may be less than the third value (0.76), and thus the shape of the second single aggregates SAG2 may be classified as a branched shape.

As described above, according to an embodiment of the present invention, the above-described parameters (aspect ratio, roundness, and solidity) may be measured through the TEM image of the single aggregates, and the algorithm of FIG. 7 may be performed through the measured parameters, and thus the shape of the single aggregates may be classified as one of the linear shape, branched shape, elliptical shape and circular shape.

The shape classification may be performed on 20 to 100 single aggregates at random among the single aggregates separated and collected from the fumed silica as an analysis target, and a shape distribution ratio of the single aggregates of the fumed silica as the analysis target may be measured.

For example, as a result of performing the shape classification on 100 single aggregates collected from the finned silica, it was confirmed that 2 single aggregates were linear, 28 single aggregates were branched, and 49 single aggregates were elliptical, 21 single aggregates were circular. In this case, it may be confirmed that the fumed silica has the shape distribution ratio of 2% linear, 28% branched, 49% elliptical, and 29% circular. It may be seen that, in the aggregates in the abrasive ABR according to the embodiment, the ratio of the round shape is 70% and the ratio of the elongated shape is 30%, thereby having a relatively large ratio of round shape.

An abrasive was prepared based on preparing finned silicas shown in Table 1 below.

TABLE 1

| | Specific Surface Area (m²/G) | Linear Shape (%) | Branched Shape (%) | Elliptic Shape (%) | Circular Shape (%) |
|---|---|---|---|---|---|
| Comparative Example 1 | 60 | 18 | 48 | 29 | 5 |
| Comparative Example 2 | 90 | 24 | 52 | 21 | 3 |
| Comparative Example 3 | 150 | 13 | 69 | 15 | 3 |

TABLE 1-continued

| | Specific Surface Area (m²/G) | Linear Shape (%) | Branched Shape (%) | Elliptic Shape (%) | Circular Shape (%) |
|---|---|---|---|---|---|
| Example 1 | 200 | 0 | 20 | 48 | 32 |
| Example 2 | 300 | 2 | 28 | 49 | 21 |
| Example 3 | 400 | 0 | 22 | 44 | 34 |

Fumed silica according to Comparative Examples 1 to 3 had a relatively small specific surface area of 150 m²/g or less, and a ratio of an elongated shape (linear shape+ branched shape) in aggregates was greater than 50%.

On the other hand, fumed silica according to Examples 1 to 3 of the present invention had a relatively large specific surface area of 200 m²/g or more, and a ratio of a round shape (elliptic shape+circular shape) in aggregates was greater than 50%.

Additionally, an abrasive was prepared using colloidal silica rather than fumed silica (Comparative Example 4).

Figure 11:
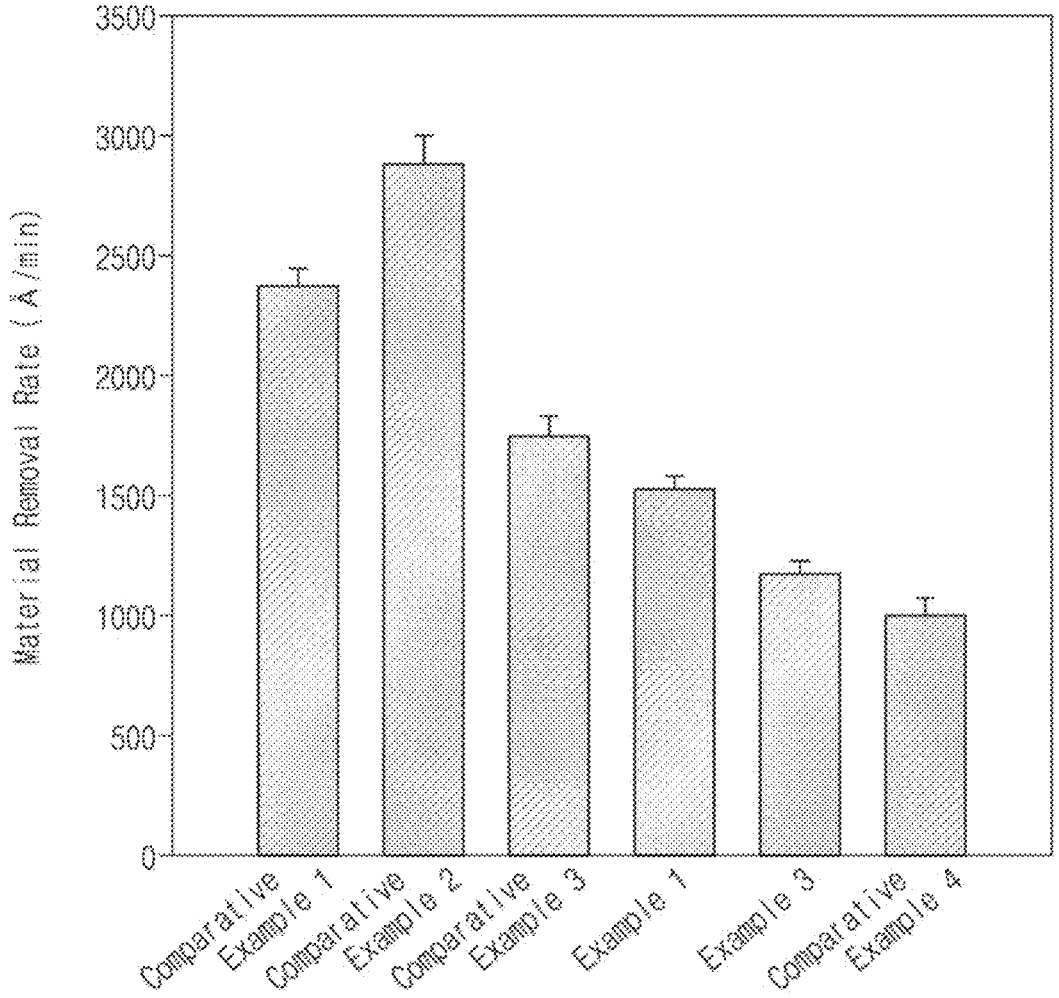
FIG. 11 is a graph illustrating a material removal rate of an abrasive according to Examples of the present invention and Comparative Examples.
Figure 12:
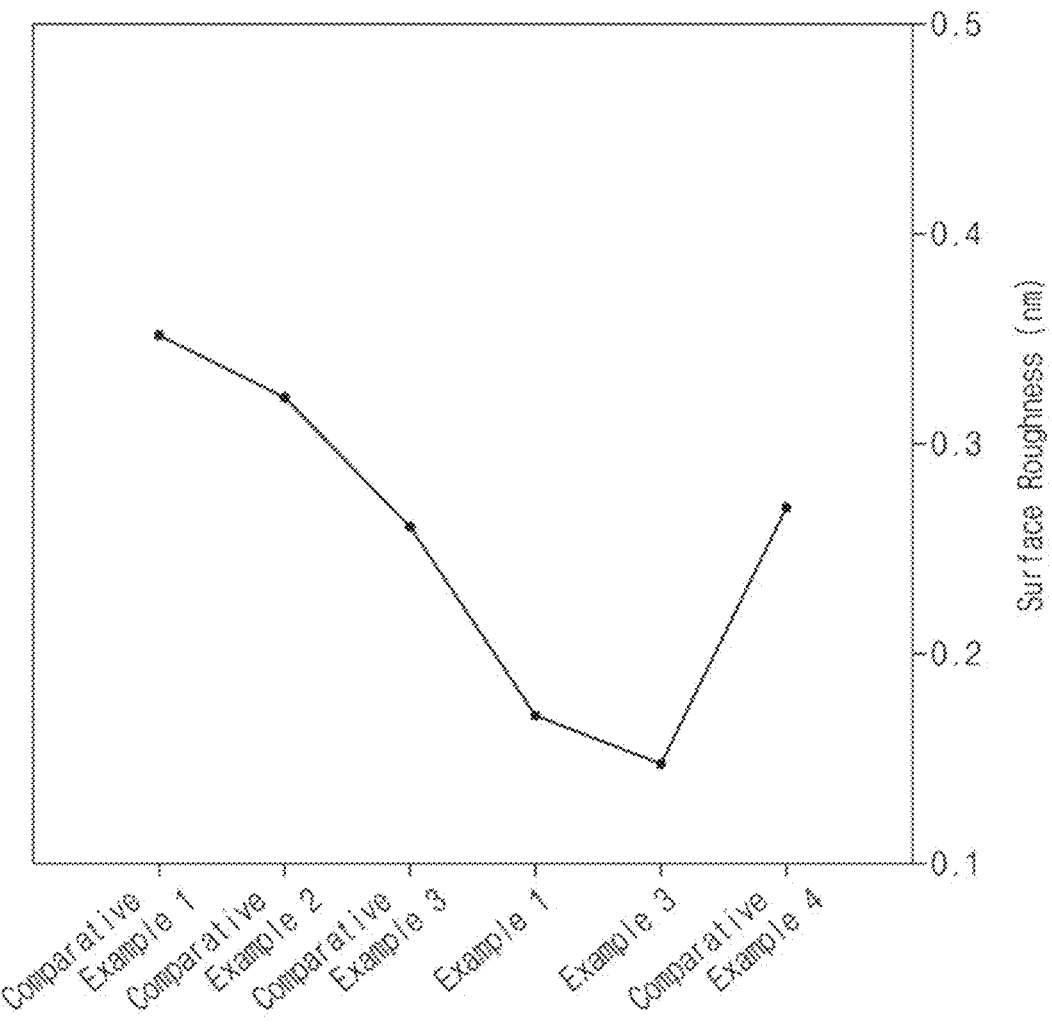
FIG. 12 is a graph illustrating a surface roughness of a polishing target of an abrasive according to Examples of the present invention and Comparative Examples.

A CMP process was performed on the abrasives according to Comparative Examples 1 to 4, Examples 1 and 3, and a material removal rate MRR was measured and shown in FIG. 11, and a surface roughness of a polishing target was measured and shown in FIG. 12.

Referring to FIG. 11, the material removal rates of Examples 1 and 3 were relatively small compared to those of Comparative Examples 1 to 3. However, it may be confirmed that the material removal rates of Examples 1 and 3 are higher than those of Comparative Example 4, which is colloidal silica.

Referring to FIG. 12, the surface roughness of Examples 1 and 3 was smaller than the surface roughness of Comparative Examples 1 to 3. Furthermore, the surface roughness of Examples 1 and 3 was smaller than that of Comparative Example 4, which was colloidal silica.

As a result, compared to the colloidal silica abrasive used to reduce scratches on the polishing surface, it may be confirmed that the abrasive according to embodiments of the present invention has a more excellent scratch reduction effect. Furthermore, it may be seen that the abrasive according to the embodiments of the present invention has a higher material removal rate than that of the colloidal silica abrasive.

The abrasive according to embodiments of the present invention may basically use the fumed silica, and thus the material removal rate may be relatively good. Furthermore, the ratio of the round shape of the aggregates in the abrasive may be 50% or more, and thus the round secondary particles may more gently polish the surface of the object to be polished. Accordingly, the surface roughness of the object to be polished may be very low, and thus, the abrasive of the present invention may be applied to a fine semiconductor process requiring fineness.

FIGS. 13 to 16 are cross-sectional views for illustrating a CMP process on a wafer according to embodiments of the present invention. The CMP process to be described in this embodiment may exemplify one of numerous semiconductor processes performed to form a semiconductor device on a wafer.

Figure 13:
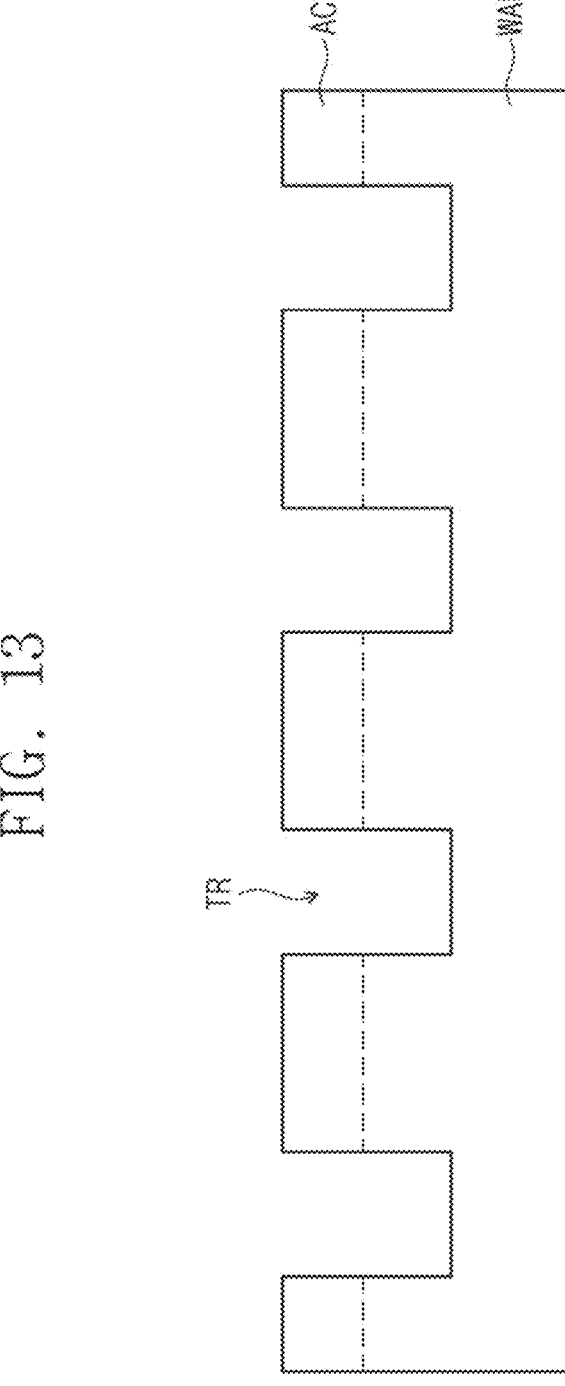

Referring to FIG. 13, a wafer WAF may be provided. The wafer WAF, which is a semiconductor wafer, may be, for example, a silicon wafer.

An upper part of the wafer WAF may be patterned, to form trenches TR defining active regions ACT on the upper part of the wafer WAF. The trenches TR may have a certain depth and may be formed on the wafer WAF. Each of the active regions ACT may be an active of a transistor of a semiconductor device.

Figure 14:
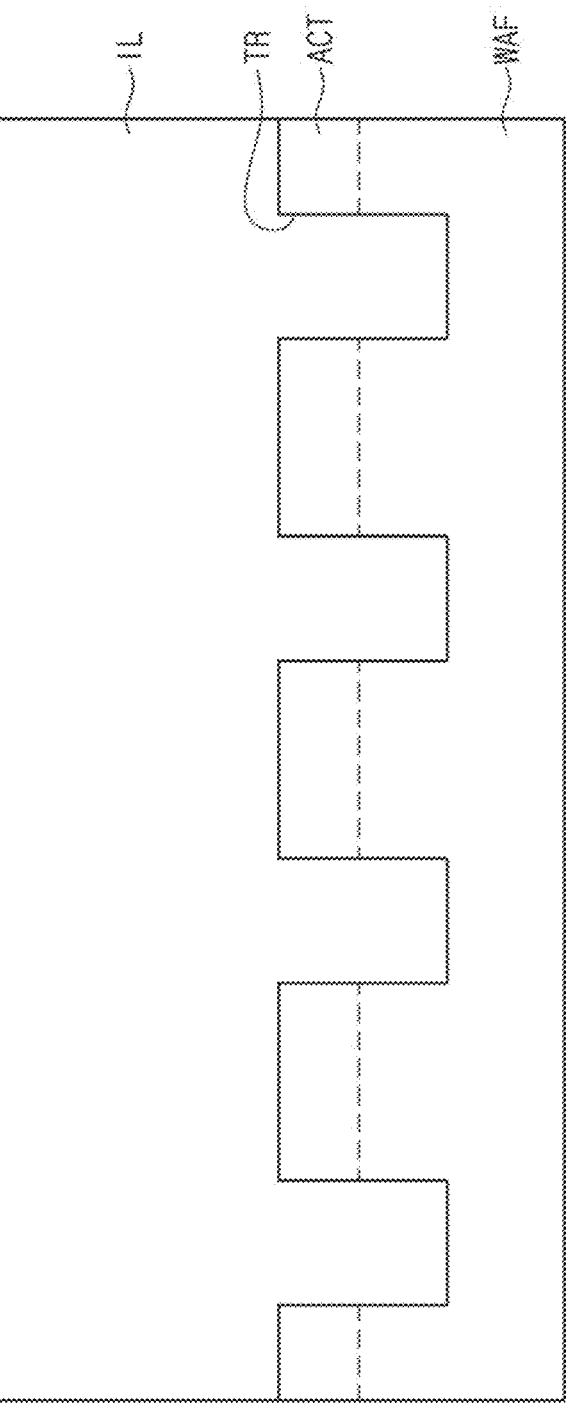

Referring to FIG. 14, an insulating layer IL filling the trenches TR may be formed on the wafer WAF. The insulating layer IL may be formed thick enough to fill the trenches TR and completely cover a surface of the wafer WAF. For example, the insulating layer IL may be formed using a chemical vapor deposition (CVD) process. The insulating layer IL may include a silicon oxide layer, a silicon oxynitride layer, or a silicon nitride layer. The insulating layer IL may be a layer to be polished in the present embodiment.

Figure 15:
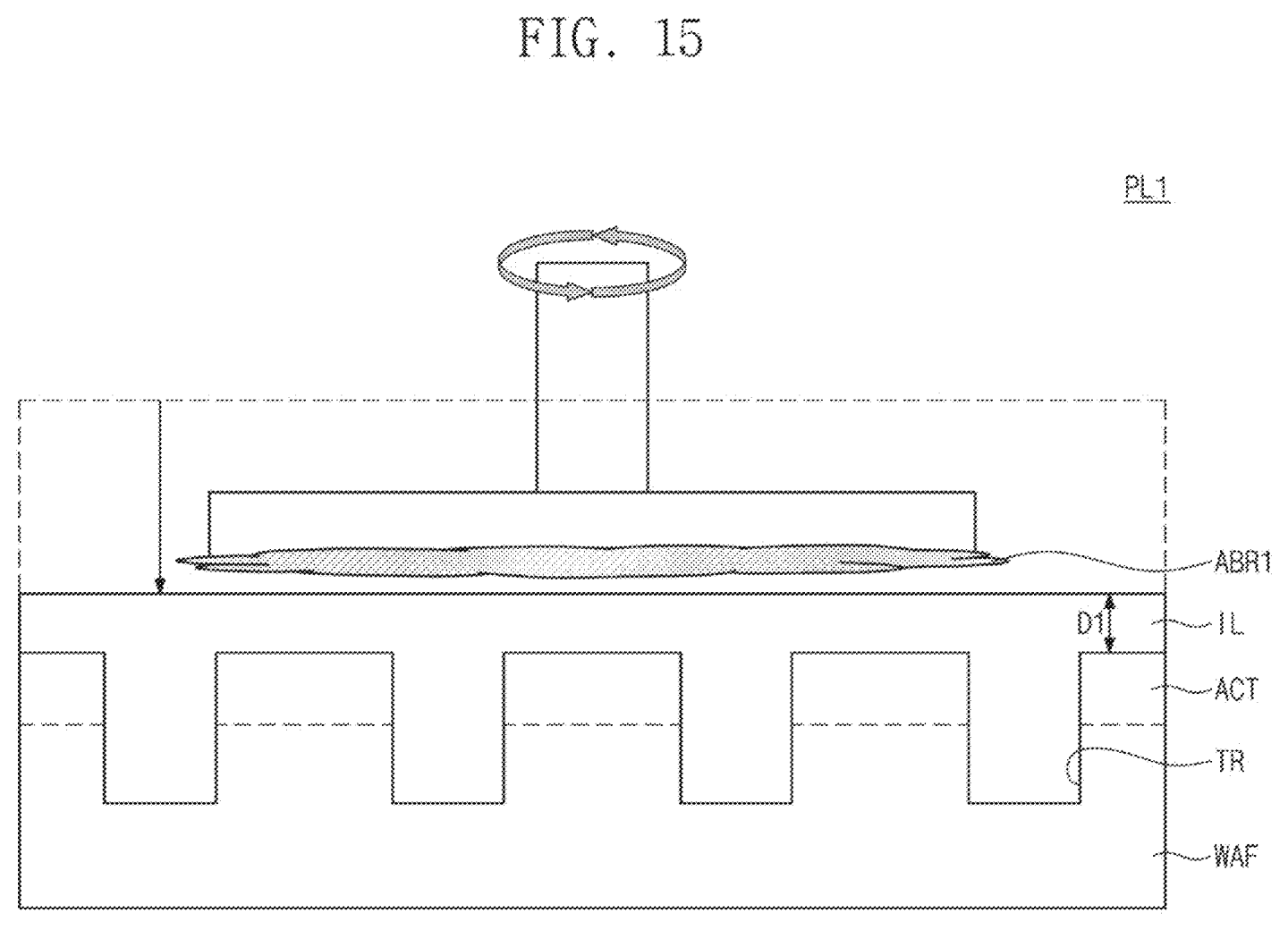

Referring to FIG. 15, a first planarization process PL1 may be performed on the insulating layer IL. The first planarization process PL1 may be performed using a first abrasive ABR1. An abrasive having a high material removal rate may be used as the first abrasive ABR1. For example, a fumed silica abrasive having a specific surface area of 1 m²/g to 150 m²/g previously described with reference to Comparative Examples 1 to 3 may be used as the fug abrasive ABR1.

The first planarization process PL1 may be performed until a top surface of the insulating layer IL reaches a predetermined distance DI from the surface of the wafer WAF. For example, the distance DI may be 50 nm to 200 nm.

Figure 16:
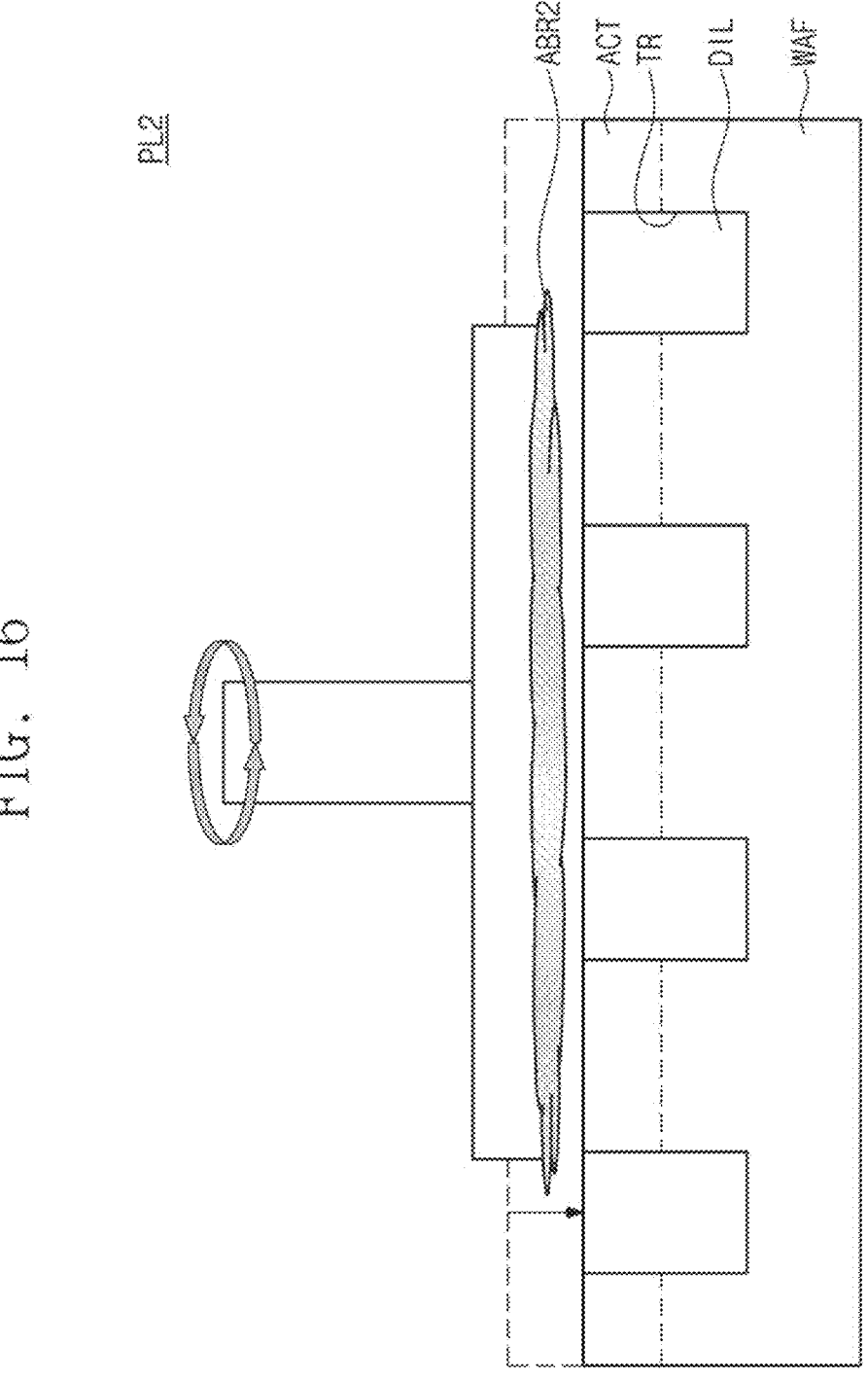

Referring to FIG. 16, a second planarization process PL2 may be performed on the insulating layer IL. The second planarization process PL2 may be performed until the surface of the wafer WAF is exposed. As a result of the second planarization process PL2, a device isolation layer DIL may be formed while the insulating layer IL selectively remains only in the trench TR.

The second planarization process PL2 may be performed using the second abrasive ABR2. The second planarization process PL2 may require a fine operation of exposing the surface of the wafer WAF, and thus an abrasive capable of lowering the surface roughness of the polishing surface may be used as the second abrasive ABR2. For example, the second abrasive ABR2 may be an abrasive according to embodiments of the present invention.

As described above, the abrasive of the present invention gently polishes the polishing surface (i.e., the surface of the wafer WAF) using round secondary particles, and thus occurrence of scratches on the surface of the wafer WAF may be significantly reduced. The surface of the wafer WAF may be the active region ACT used as the active of the transistor as described above, and thus when the surface roughness is reduced, electrical characteristics of a semiconductor device to be finally formed may be improved.

According to the CMP process of the present invention, when a surface far away from the surface of the wafer WAF is polished, the first abrasive ABR1 having a high material removal rate may be used to shorten a process time. Meanwhile, when a surface approaches the surface of the wafer WAF, using the second abrasive ABR2 that is capable of being polished more precisely and softly, and thus damage to the surface of the wafer WAF may be prevented.

The CMP process using the abrasive of the present invention may be applied to a front end of line (FEOL) process performed on the surface of a wafer during a semiconductor device manufacturing process. When the abrasive of the present invention is used, precise processing may be performed without the scratches on the surface to be polished, and thus it may be suitable for processing the surface of the wafer used as the active region of the semiconductor device.

The invention claimed is:

1. An abrasive for chemical mechanical polishing (CMP) comprising fumed silica, wherein a BET specific surface area of the fumed silica is 200 $m^2$/g to 400 $m^2$/g, wherein a shape of aggregates of fumed silica dispersed in the abrasive is an elongated shape or a round shape, wherein a ratio of a number of the aggregates having the round shape to a total number of the aggregates is 78% to 80%, and wherein the aggregates are secondary particles formed by disagglomerating tertiary particles of the fumed silica and dispersing them in water.

2. The abrasive for the CMP of claim 1, wherein, in the aggregates, the round shape has:

an aspect ratio greater than 0.533; and a roundness greater than 0.7 or a solidity greater than 0.76, wherein a given aggregate of the aggregates dispersed in the abrasive has a first length, which is the longest length of the given aggregate in a first direction, and a second length, which is the shortest length of the given aggregate in a second direction intersecting the first direction, and the aspect ratio of the given aggregate is a ratio of the second length to the first length, wherein the given aggregate has a first area two-dimensionally, a circle having the first length as a diameter has a second area, and the roundness of the given aggregate is a ratio of the first area to the second area, and wherein the given aggregate comprises outermost particles of fumed silica, and a third area is defined by a polygon encompassing the given aggregate, the poly-gon being formed by connecting outermost points on the outermost particles with straight lines in a two-dimensional plane, and the solidity of the given aggregate is a ratio of the first area to the third area.

3. The abrasive for the CMP of claim 1, further comprising at least one of a dispersant, a pH adjuster, a surfactant, a viscosity adjuster, and an etchant capable of increasing etch selectivity of the abrasive.

4. A planarization method comprising:

forming a polishing target layer on a wafer; and planarizing the polishing target layer using the abrasive of claim 1 until a surface of the wafer is exposed.

5. The planarization method of claim 4, wherein the planarization method is used in a front end of line (FEOL) process in a semiconductor device manufacturing process.

6. The planarization method of claim 4, wherein the planarizing of the polishing target layer includes:

performing a first planarization process on the polishing target layer using a first abrasive; and performing a second planarization process using a second abrasive on the polishing target layer, and wherein the first abrasive includes fumed silica having a BET specific surface area of 1 $m^2$/g to 150 $m^2$/g, and wherein the second abrasive is the abrasive of claim 1.

7. The planarization method of claim 6, wherein the first planarization process is performed until a surface of the polishing target layer reaches a predetermined distance from the surface of the wafer, and wherein the second planarization process is performed until the surface of the wafer is exposed.

8. The planarization method of claim 4, further comprising forming a trench defining an active area on the wafer, and wherein the polishing target layer fills the trench.

* * * * *